US006259188B1

(12) United States Patent
Woodard et al.

(10) Patent No.: US 6,259,188 B1
(45) Date of Patent: Jul. 10, 2001

(54) PIEZOELECTRIC VIBRATIONAL AND ACOUSTIC ALERT FOR A PERSONAL COMMUNICATION DEVICE

(75) Inventors: Stanley E. Woodard; Richard F. Hellbaum, both of Hampton; Robert H. Daugherty, Yorktown; Raymond C. Scholz, Gloucester; Bruce D. Little, Yorktown; Robert L. Fox, Gloucester, all of VA (US); Gerald A. Denhardt, Dayton, OH (US); SeGon Jang, Dayton, OH (US); Rizza Balein, Dayton, OH (US)

(73) Assignee: Projects Unlimited, Inc., Dayton, OH (US)

( * ) Notice: Subject to any disclaimer, the term of this patent is extended or adjusted under 35 U.S.C. 154(b) by 0 days.

(21) Appl. No.: 09/386,682

(22) Filed: Aug. 31, 1999

Related U.S. Application Data

(63) Continuation-in-part of application No. 09/344,030, filed on Jun. 25, 1999.

(60) Provisional application No. 60/098,658, filed on Aug. 31, 1998.

(51) Int. Cl.[7] .................................................. H01L 41/053

(52) U.S. Cl. .......................... 310/330; 310/317; 310/328; 310/348; 310/353; 310/367

(58) Field of Search .................................... 310/317, 328, 310/311, 324, 330, 340, 348, 353, 354, 367, 369

(56) References Cited

U.S. PATENT DOCUMENTS 4,035,672 7/1977 Beaverson et al. .................. 310/8.7
4,122,365 10/1978 Stephens .............................. 310/324
4,626,730 12/1986 Hubbard, Jr. ........................ 310/326
5,172,092 12/1992 Nguyen et al. ................... 340/311.1
5,229,774 7/1993 Ogura ............................... 340/311.1
5,374,011 12/1994 Lazarus et al. .................... 244/75 R
5,415,633 5/1995 Lazarus et al. ........................ 604/95
5,471,721 12/1995 Haertling ............................ 29/25.35
5,656,882 8/1997 Lazarus et al. ...................... 310/328
5,687,462 11/1997 Lazarus et al. ..................... 29/25.35
5,780,958 7/1998 Strugach et al. ..................... 310/348
5,857,694 1/1999 Lazarus et al. ...................... 280/602
5,866,971 2/1999 Lazarus et al. ...................... 310/328
5,973,441 10/1999 Lo et al. ............................. 310/330

OTHER PUBLICATIONS

International Search Report of PCT/US99/19911 mailed Mar. 21, 2000.

*Primary Examiner*—Thomas M. Dougherty
(74) *Attorney, Agent, or Firm*—Thompson Hine LLP

(57) ABSTRACT

An alert apparatus for a personal communication device includes a mechanically prestressed piezoelectric wafer positioned within the personal communication device and an alternating voltage input line coupled at two points of the wafer where polarity is recognized. The alert apparatus also includes a variable frequency device coupled to the alternating voltage input line, operative to switch the alternating voltage on the alternating voltage input line at least between an alternating voltage having a first frequency and an alternating voltage having a second frequency. The first frequency is preferably sufficiently high so as to cause the wafer to vibrate at a resulting frequency that produces a sound perceptible by a human ear, and the second frequency is preferably sufficiently low so as to cause the wafer to vibrate at a resulting frequency that produces a vibration readily felt by a holder of the personal communication device.

42 Claims, 7 Drawing Sheets

PIEZOELECTRIC VIBRATIONAL AND ACOUSTIC ALERT FOR A PERSONAL COMMUNICATION DEVICE

CROSS REFERENCE TO RELATED APPLICATIONS

This application is a continuation-in-part of Application Ser. No. 09/344,030, filed Jun. 25, 1999 and also claims priority under 35 U.S.C. §119 from Provisional Application Ser. No. 60/098,658 filed Aug. 31, 1998, the entire disclosure of which is incorporated herein by reference.

ORIGIN OF INVENTION

The invention disclosed herein was jointly conceived and made by employees of the United States Government and employees of Projects Unlimited, Inc. under a Space Act Agreement No. MOA#400.

BACKGROUND

The present invention relates to personal communication devices, and more particularly, to a vibrational and/or acoustic transducer for use with personal communication devices.

Vibrating alarms for use with personal communication devices are well known in the art. Many of these alarms comprise conventional motors having an eccentric weight attached to the rotor shaft. Accordingly, when the motor is activated, the rotation of the rotor shaft and corresponding rotation of the eccentric weight causes vibration within the personal communication device that is detected by the holder of the device. Typically, such vibrating alarms are not capable of also producing an acoustic alert signal; or if the vibrating alarm is capable of producing an acoustic alert signal, the design of the combination vibrating/acoustic alarm is complicated—rendering it not feasible for inexpensive mass production.

Accordingly, a need exists for a combination vibrating and acoustical alarm mechanism that has a relatively uncomplicated design, is relatively inexpensive to produce, that is substantially durable and is suited (relatively light-weight and small) to be incorporated into a hand-held communication device.

SUMMARY

One aspect of the present invention is to provide an alert apparatus for a personal communication device that includes: a mechanically prestressed piezoelectric wafer positioned within the personal communication device and an alternating voltage input line coupled at two points of the wafer where polarity is recognized. Preferably the alert apparatus also includes a variable frequency device coupled to the alternating voltage input line, operative to switch the alternating voltage on the alternating voltage input line at least between an alternating voltage having a first frequency and an alternating voltage having a second frequency. The first frequency is preferably sufficiently high so as to cause the wafer to vibrate at a resulting frequency that produces a sound perceptible by a human ear, and the second frequency is preferably sufficiently low so as to cause the wafer to vibrate at a resulting frequency that produces a vibration readily felt by a holder of the personal communication device.

It is another aspect of the present invention to provide a personal communication device (such as a wireless telephone or pager) that includes: a housing; a receiver component, mounted within the housing, for receiving messages transmitted to the communications device; a processor, mounted within the housing, operatively coupled to the receiver component for processing messages received by the receiver component; and an alarm apparatus operatively coupled to the processor; where the alarm includes: a mechanically prestressed piezoelectric wafer positioned within the personal communication device and an alternating voltage input line coupled at two points of the wafer where polarity is recognized. Preferably the alarm also includes a variable frequency device coupled to the alternating voltage input line, operative to switch the alternating voltage on the alternating voltage input line at least between an alternating voltage having a first frequency and an alternating voltage having a second frequency. The first frequency is preferably sufficiently high so as to cause the wafer to vibrate at a resulting frequency that produces a sound perceptible by a human ear, and the second frequency is preferably sufficiently low so as to cause the wafer to vibrate at a resulting frequency that produces a vibration readily felt by a holder of the personal communication device. Usually, the frequency of the high frequency supply is approximately 1200 to 20,000 Hz and the frequency of the low frequency supply is less than approximately 300 Hz.

It is also preferred that the personal communication device includes a voltage amplifier operatively coupled to the alternating voltage input line to amplify the alternating voltage input to the wafer, producing an amplified, alternating voltage signal, where the amplified, alternating voltage signal is approximately 20 Volts to approximately 120 Volts. However, with some applications of the present invention, the voltage amplifier may amplify the signal up to approximately 300 Volts.

It is also preferred that the wafer be clamped to the housing of the personal communication device at one or both ends of the wafer or that the wafer be held within a guide mounted within the housing, where the wafer is not attached to the guide or to the housing. Alternatively, the wafer may be clamped to a sounding board, which is in-turn fixed to the housing of the personal communication device.

In an alternate embodiment of the invention, the transducer includes an additional weight or tuning mass attached to the wafer. The additional tuning mass, when combined with the mass of the wafer and the spring constant of the wafer, permits the resonant vibrational frequency of the system to be more definitely tuned to a desired frequency. In another alternate embodiment of the invention, the transducer includes a speaker assembly that provides better impedance matching to the air. This allows a voice frequency range to be produced by the device. Thus the device not only produces an acoustic alert, but may also produce acoustic sounds having a voice range frequency capability.

Accordingly, it is an object of the present invention to provide a combination vibrating and acoustical alarm mechanism that has a relatively uncomplicated design, is relatively inexpensive to produce, is substantially durable and is suited (relatively light-weight and small) to be incorporated into a hand-held communication device. These and other objects and advantages of the present invention will be apparent from the following description, the appended claims and the attached drawings.

DETAILED DESCRIPTION

Figure 1A:
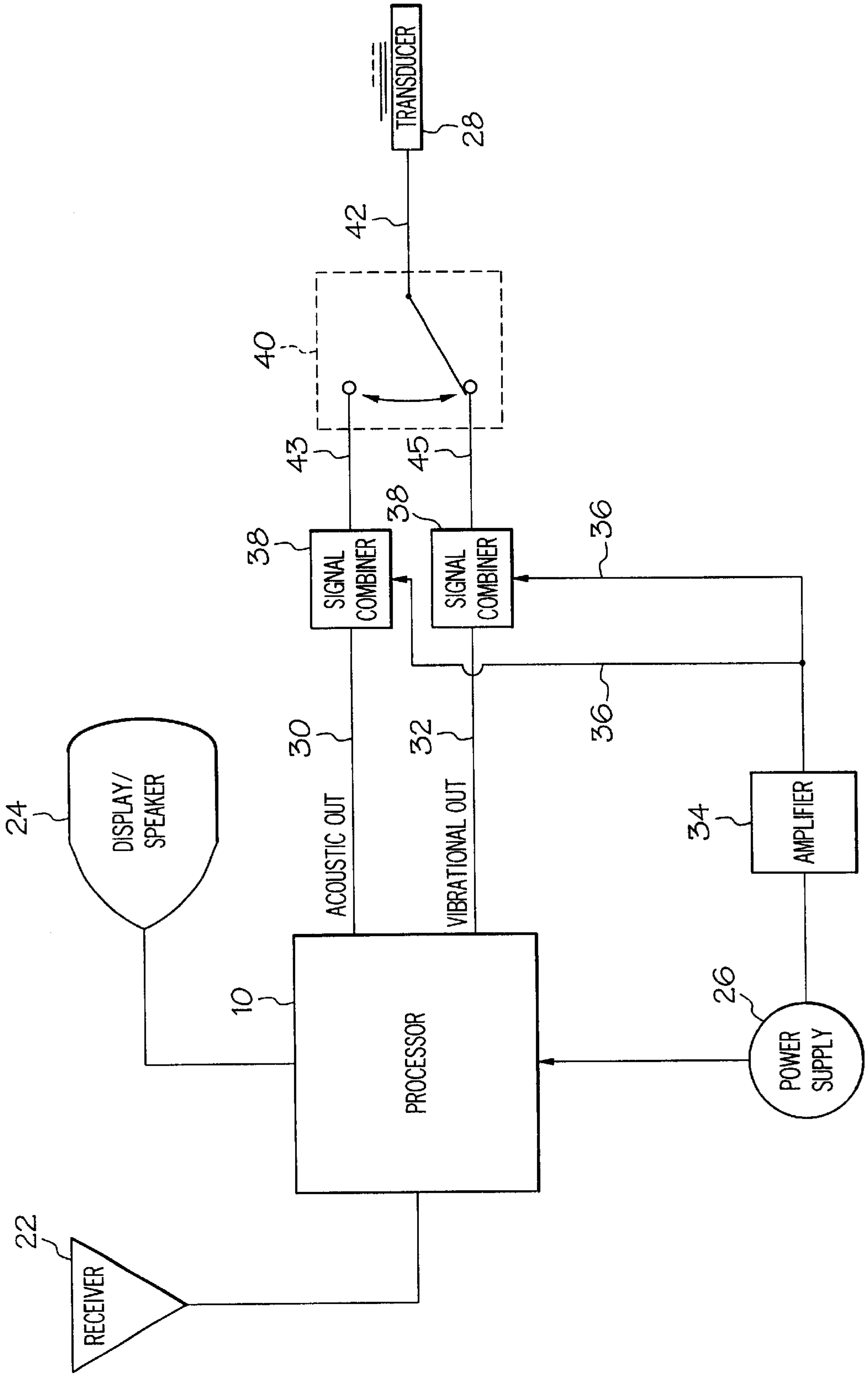
FIG. 1A is a schematic, block diagram representation of a personal communication device incorporating the transducer of the present invention.

As shown in FIG. 1A, a cellular telephone, pager or other typical personal communication device typically includes a central processor 10 such as a micro-processor, micro-controller or other similar processing device; a receiver 22 such as an RF antenna, an infra-red sensor or other related reception device; an output device 24 such as an LCD or LED display component and/or an ear-piece component; and a power supply 26, such as a battery, a solar cell, or any other known means for providing power to the various components of the personal communication device. Such components are well known to those of ordinary skill in the art and will therefore not be discussed in significant detail herein. Generally, the processor tends to receive information transmitted to the personal communication device from the receiver 22 and relays that information to the user of the personal communication device by controlling the output device 24. The personal communication device will also include a transducer 28 of the present invention for alerting a user of the device of an incoming message, for example. As will be described in detail below, the transducer is preferably adapted to provide both vibrational and/or acoustic alerts to the user. Accordingly, the processor includes an acoustic signal output 30 and a vibrational signal output 32. The acoustic signal output transmits an alternating voltage signal at a frequency of approximately 1200 to approximately 20000 Hz; while the vibrational signal output 32 transmits an alternating voltage signal at approximately 300 Hz or less. It is to be understood that an "alternating voltage" signal may be a standard AC signal or a switched DC signal (such as a square wave and the like).

The transducer 28 is preferably a piezoelectric wafer 44 (see FIGS. 2–10) formed substantially according to the process described in U.S. Pat. 5,632,841 to Hellbaum, et al., the disclosure of which is incorporated herein by reference. This wafer includes a piezoelectric layer which is bonded to an adhesive layer, such as a polyimide, at elevated temperatures so that the differential thermal compression rates of these two layers imparts a mechanical prestress into the layers. Such a mechanically prestressed piezoelectric device is commercially available from Par Technologies, Newport News, Va.

It has been found that upon applying an alternating input voltage having a frequency of approximately 1200 to 20,000 Hz to the wafer 44, at two sides of the wafer where polarity is recognized, causes the wafer to vibrate at a resulting frequency to produce a sound which is perceptible by the human ear. It has also been found that upon applying an alternating voltage at a low frequency of approximately 300 Hz or less, to the wafer 44 produces a readily perceptible vibration for the transducer 28 which will be perceived by the holder of the personal communication device. The voltage level needed to vibrate the wafer depends upon the thickness of the ceramic material and preferably ranges from 20 to 120 volts (amplified from a 1.5 to 10 volt base supply 26), although voltages of up to approximately 300 volts may be necessary.

Accordingly, the personal communication device also includes a voltage amplifier 34 for amplifying the voltage from the power supply 26 into an amplified voltage signal 36 as required by the piezoelectric wafer and the given application. These amplified voltage signals 36 are provided to signal combiners 38 which respectively combine the amplified voltage signals 36 with the acoustic output signal 30 or the vibrational output signal 32. The personal communication device also includes a switch 40 which may be controlled mechanically or electronically by the user. This switch 40 switches the input 42 into the transducer 28 between the amplified acoustic output signal 43 or the amplified vibrational output signal 45. The switch 40 can be controlled manually by a user or may be controlled by the processor 10.

Figure 1B:
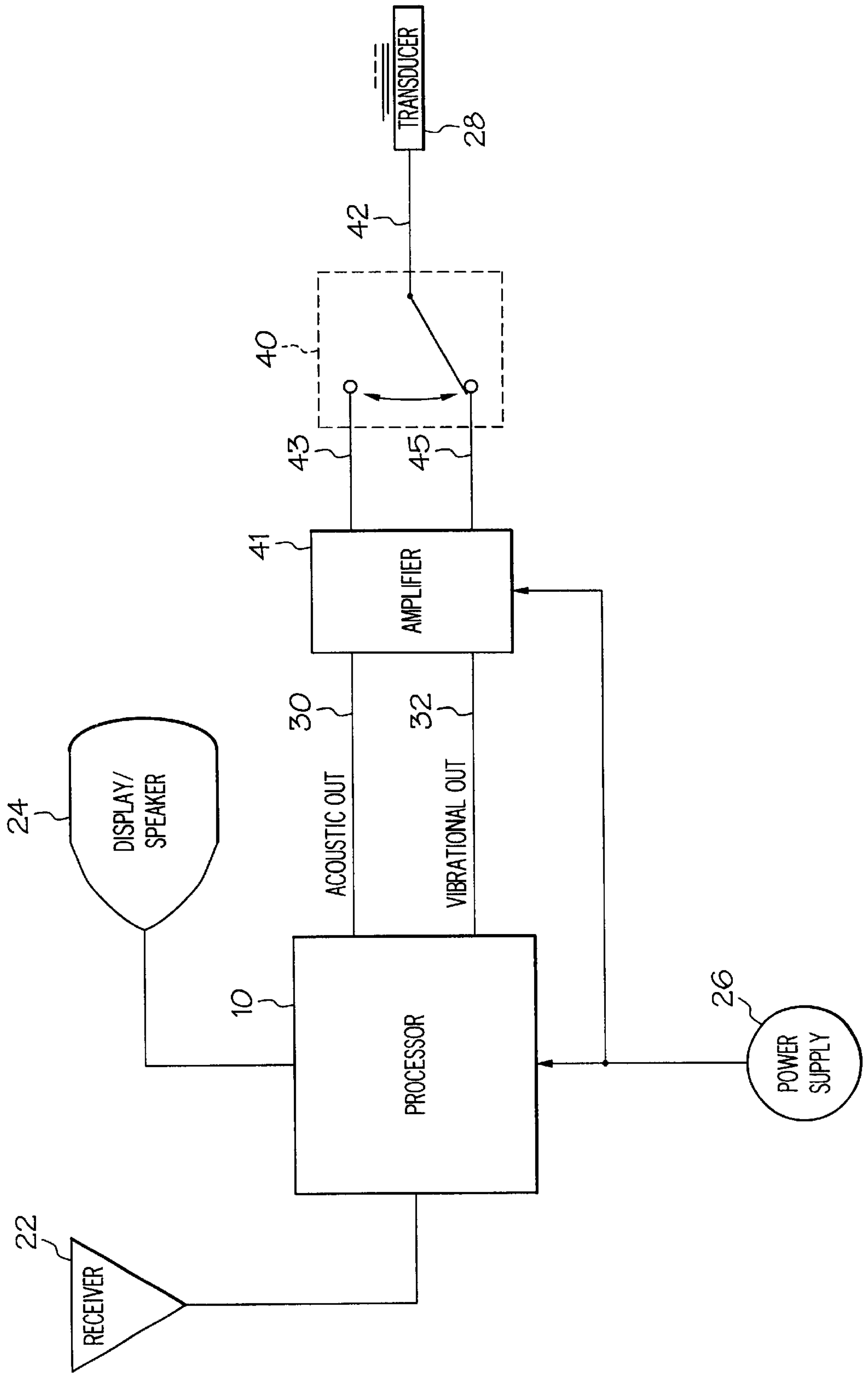
FIG. 1B is a schematic, block diagram representation of an alternate personal communication device incorporating the transducer of the present invention.

As shown in FIG. 1B, an alternate configuration of the personal communication device circuit utilizes a voltage amplifier device 41 operatively positioned between the processor 10 and the switch 40 for amplifying the alternating voltage acoustic signal 30 and vibrational signal 32 outputs from the processor to the amplified acoustic output signal 43 and amplified vibrational signal 45.

Figure 1C:
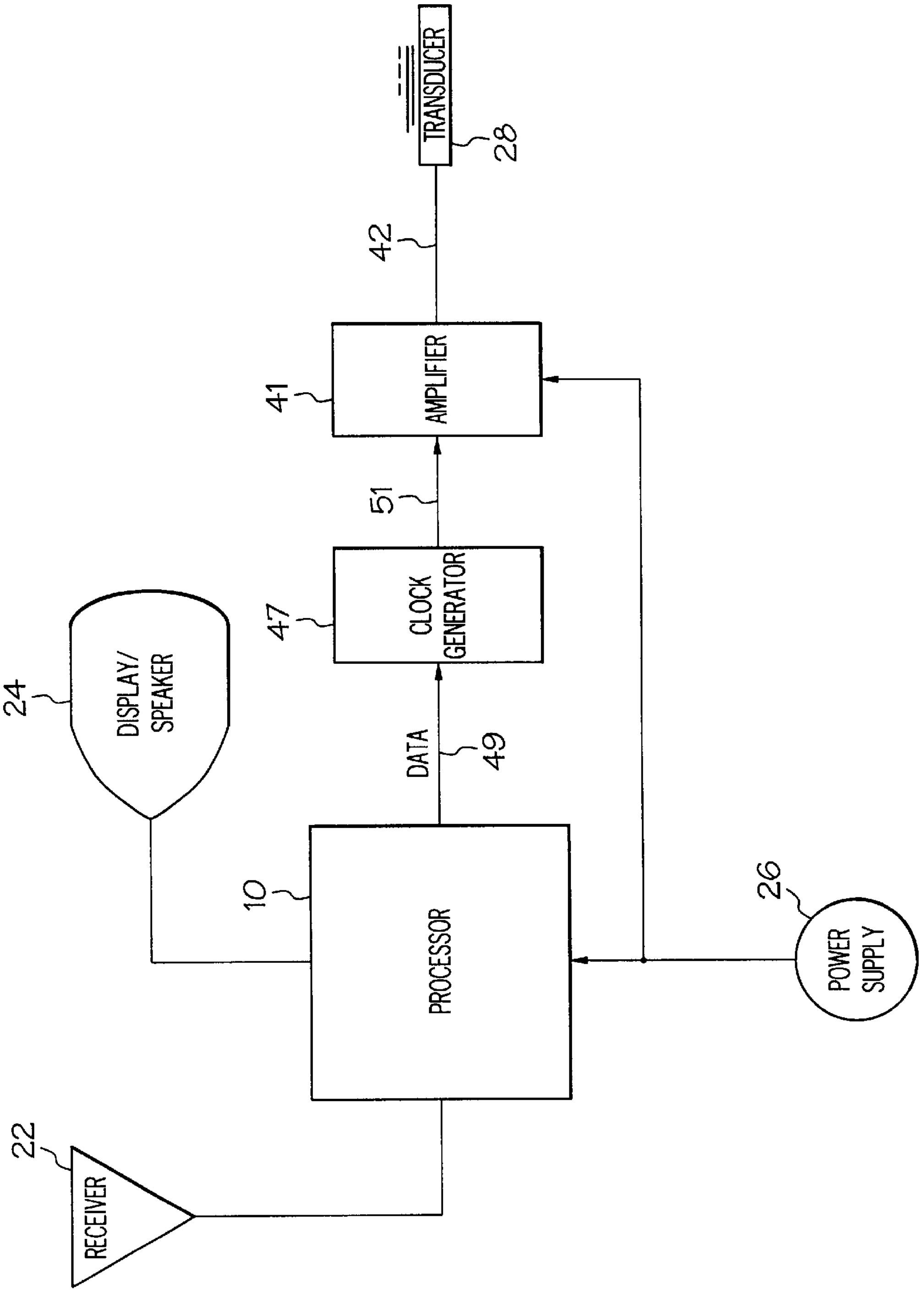
FIG. 1C is a schematic, block diagram representation of another alternate personal communication device incorporating the transducer of the present invention.

As shown in FIG. 1C, another alternate configuration of the circuit may include a programmable clock generator device 47 controlled by the microprocessor, via data signal 49, for generating the desired frequency output 51, where the single frequency output of this device would be amplified by the amplifier device 41 to provide the input 42 into the transducer 28. Therefore, in this alternate configuration, the operation of the switch 40 of FIGS. 1A and 1B is replaced by the processor control.

Figure 2:
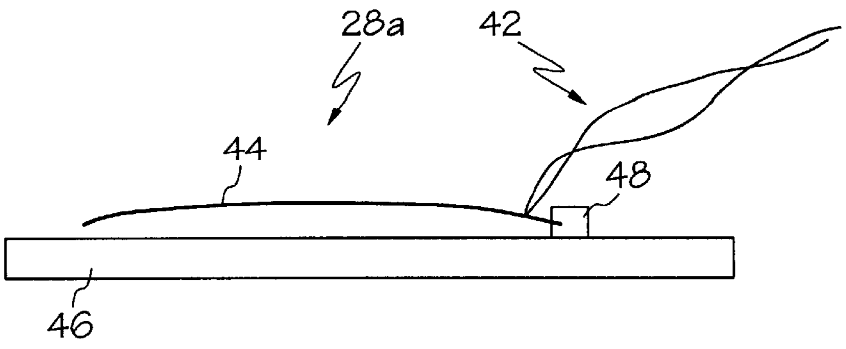
FIG. 2 is a schematic, elevational side view of a first embodiment of the transducer device of the present invention.
Figure 3:
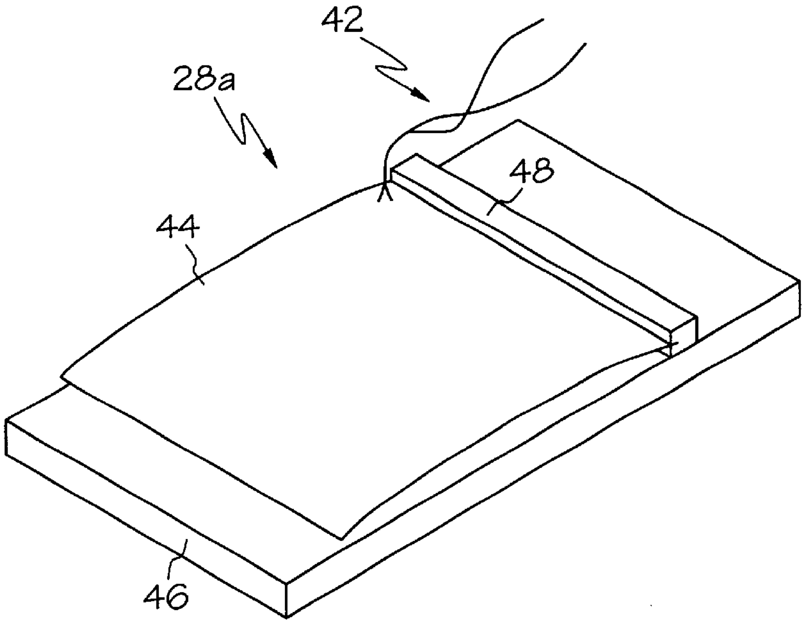
FIG. 3 is a perspective view of the transducer device of FIG. 2.
Figure 4:
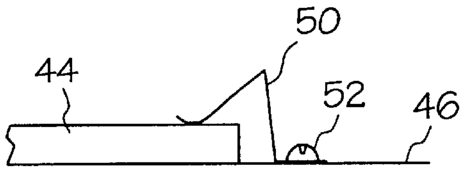
FIG. 4 is a schematic, elevational side view of an example of an alternate clamping arrangement for the transducer device of the present invention.

As shown in FIGS. 2 and 3, a first embodiment of the transducer 28*a* includes the piezoelectric wafer 44 retained on or to a sounding board 46 by a single clamp 48 which is positioned at a far end of the wafer 44. The sounding board 46 may be unitary with, or otherwise rigidly attached to the housing of the personal communication device. Preferably the wafer is a planar wafer being substantially rectangularly shaped. However, as will be appreciated by those of ordinary skill in the art, the wafer can take many shapes such as a circular shape. The clamp 48 is rigidly bounded to the case-integral sounding board 46. Suitable clamps 48 may take a variety of forms. For example, as shown in FIG. 4, a suitable clamp 48 may include a bracket 50 retaining the wafer 44 to the sounding board with a threaded screw 52. The mass of the wafer 44 combined with the spring constant of the wafer 44 provides a certain resonant frequency of the system that is tuned to the desired frequencies for vibrational and acoustic notification. The resonant frequency of the system is tuned by varying the mass or other physical attributes of the wafer (e.g., size, material constituents, etc.). Furthermore, sizing the wafer to increase the capacitance of the wafer can reduce the current (and power) needed to actuate the wafer; and increasing the wafer size also results in a greater vibratory displacement for lower frequency vibration.

Figure 5:
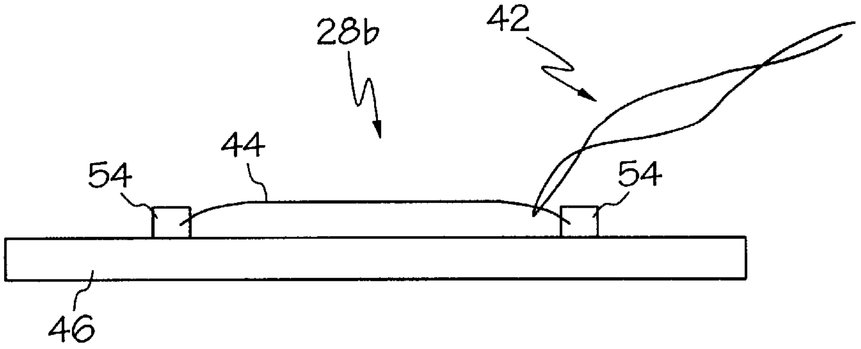
FIG. 5 is a schematic, elevational side view of a second embodiment of a transducer device of the present invention.

As shown in FIG. 5, a second embodiment of the transducer 28*b* includes the piezoelectric wafer 44 retained to the sounding board 46 by a pair of clamps 54, positioned on opposite ends of the wafer 44. While the embodiment shown in FIG. 5 will be retained to the housing 46 of the personal communication device more securely than the embodiment shown in FIGS. 2 and 3, the deflection caused by the reception of the input signal 42 will be much less than in the embodiment in FIGS. 2 and 3.

Figure 6:
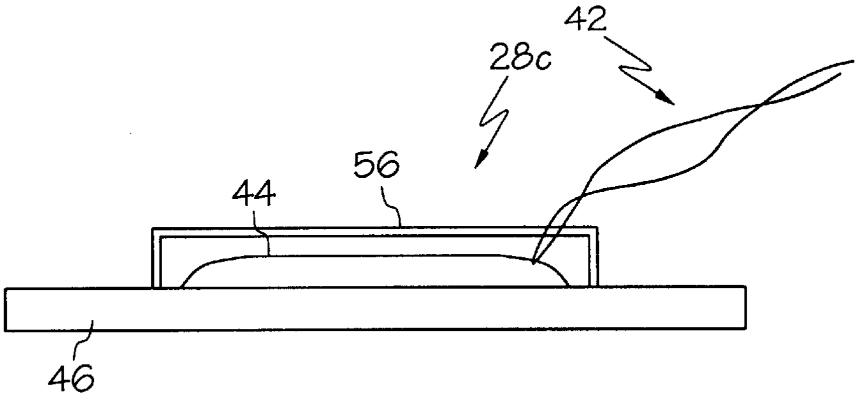
FIG. 6 is a schematic, elevational, cross-sectional side view of a third embodiment of a transducer device of the present invention.

As shown in FIG. 6, a third embodiment of the transducer 28*c* includes a box or a guide 56 mounted to the sounding board 46. The wafer 44 resides within the guide 56, but is not attached to the guide 56 or the sounding board 46. Accordingly, when power is applied to the wafer 44, it will vibrate freely within the guide 56.

Figure 7:
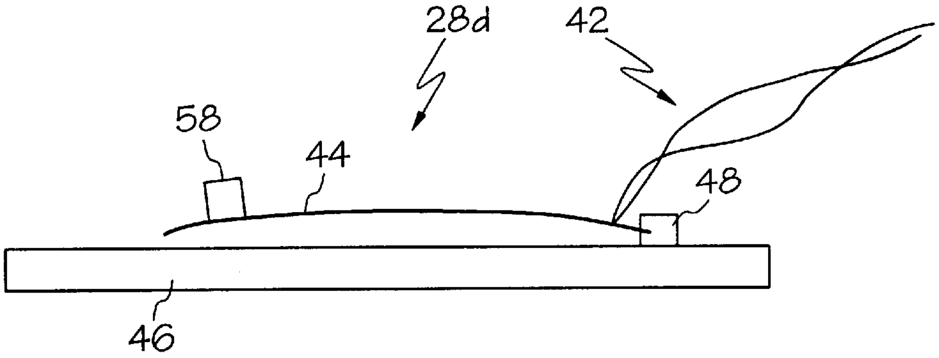
FIG. 7 is a schematic, elevational side view of a fourth embodiment of a transducer device of the present invention.
Figure 8:
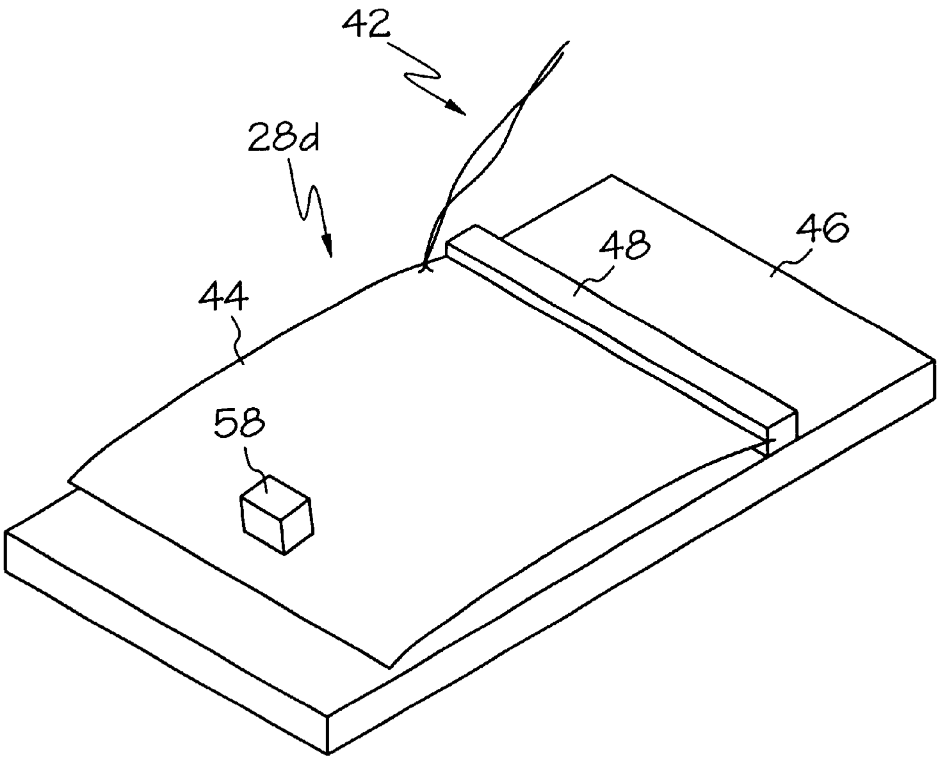
FIG. 8 is a perspective view of the transducer device of FIG. 7.

As shown in FIGS. 7 and 8, a fourth embodiment of the transducer 28*d* includes an additional weight or tuning mass 58 attached to the wafer 44. The additional tuning mass 58, when combined with the mass of the wafer and the spring constant of the wafer, permits the resonant vibrational frequency of the system to be more definitely tuned to a desired frequency. Additionally, the additional tuning mass will allow for a more readily perceptible vibrational signal from the transducer. The resonant frequency of the system is tuned to the desired frequency by varying the mass or physical attributes of the wafer 44 and the tuning mass 58 (e.g., size, material constituents, etc.), and also by varying the position and size of the tuning mass.

A prototype of the embodiment illustrated in FIGS. 7 and 8 was constructed on a rectangular wafer 44 having dimensions of 1.75×2.5 inches. The wafer 44 included constituent layers (from bottom to top) of brass, approximately 0.003–0.005 inches thick, a sprayed layer of LaRC SI, PZT, approximately 0.008 inches thick, a sprayed layer of LaRC SI, and a layer of aluminum, approximately 0.001–0.003 inches thick. The wafer 44 was clamped along its width at one end and a mass of approximately 4 to 10 grams was attached to the other end, approximately 2.25 inches from the clamp along the centerline of the wafer. Preliminary testing of the wafer 44 measured frequencies of approximately 61 Hz and 138 Hz for maximum momentum exchange.

Figure 9:
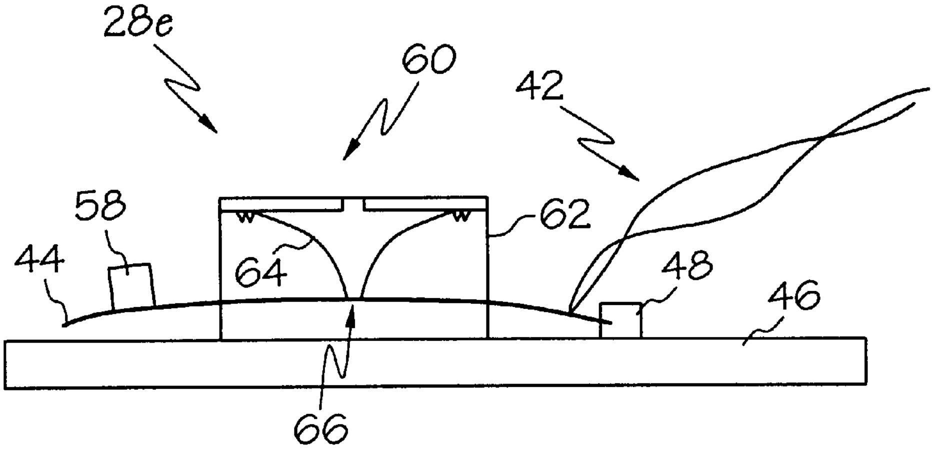
FIG. 9 is a schematic, elevational side view of a fifth embodiment of a transducer device of the present invention.
Figure 10:
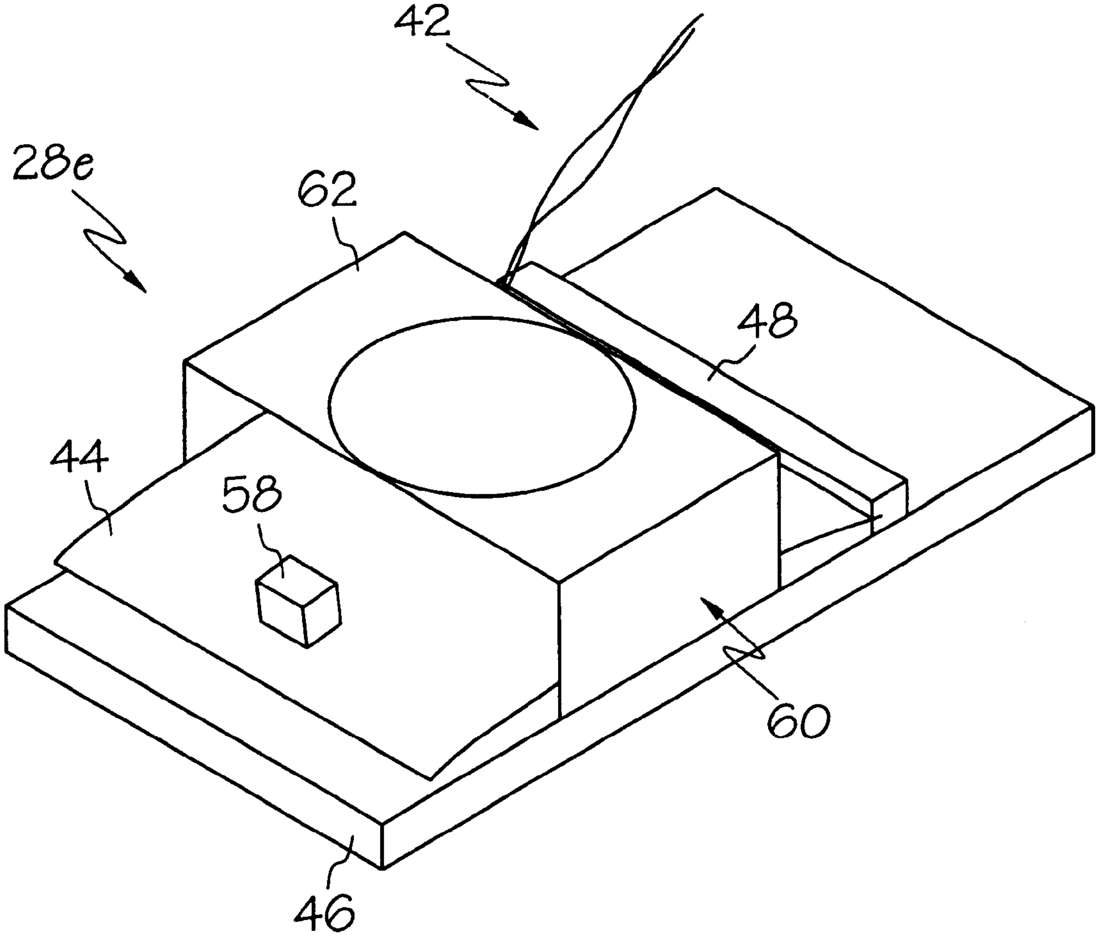
FIG. 10 is a perspective view of the transducer device of FIG. 9.

As shown in FIGS. 9 and 10, a fifth embodiment of the transducer 28*e* includes a speaker assembly 60 that allows better impedance matching to the air. This allows a voice frequency range to be produced by the device, thus providing a means not only to produce an acoustic alert, but to provide acoustic sounds having a voice range frequency capability. The speaker assembly 60 includes a speaker bracket 62 rigidly attached to the sounding board 46, a speaker cone 64, and a speaker cone attachment 66 for attaching the narrow end of the speaker cone 64 to the wafer 44. The open end of the speaker cone 64 is fastened to the speaker bracket 62 to maintain the open end of the speaker cone in a substantially fixed position during operation of the transducer. When the wafer is actuated by applying current to the current input leads 42, differential movement will be caused between the open and narrow ends of the speaker cone, thus pumping air and causing sound to be produced.

Based upon the above, it will be apparent to those of ordinary skill in the art that many different means for mounting the wafer 44 within the personal communication device are available. The more constrained the wafer is mounted, the lower the deflection of the wafer will occur when power is provided by the input signal 42. It is also within the scope of the invention to attach a diaphragm to the wafer 44 so as to provide a more distinct acoustic signal.

Following from the above description, it should be apparent to those of ordinary skill in the art that, while the designs and operations herein described constitutes several embodiments of the present invention, it is to be understood that the invention is not limited to these precise designs and operations, and that changes may be made therein without departing from the scope of the invention.

What is claimed is:

1. An alert apparatus for a personal communication device comprising:

a mechanically prestressed piezoelectric wafer adapted to be positioned within the personal communication device, the wafer having at least two points where polarity is recognized;

an alternating voltage input line coupled at the two points of the wafer where polarity is recognized; and a clamp, positioned at an end of the wafer, adapted to couple the wafer to a housing of the personal communication device.

2. The alert apparatus of claim 1, further comprising a variable frequency device coupled to the alternating voltage input line, operative to switch the alternating voltage on the alternating voltage input line at least between an alternating voltage having a first frequency and an alternating voltage having a second frequency;

wherein the first frequency is sufficiently high so as to cause the wafer to vibrate at a resulting frequency that produces a sound perceptible by a human ear and the second frequency is sufficiently low so as to cause the wafer to vibrate at a resulting frequency that produces a vibration readily felt by a holder of the personal communication device.

3. The alert apparatus of claim 2, wherein the first frequency is approximately 1200 to 20,000 Hz and the second frequency is less than approximately 300 Hz.

4. The alert apparatus of claim 3, further comprising a voltage amplifier operatively coupled to the alternating voltage input line to amplify the alternating voltage input to the wafer to produce an amplified voltage signal.

5. The alert apparatus of claim 4, wherein the amplified voltage signal is approximately 20 Volts to approximately 120 Volts.

6. The alert apparatus of claim 1 further comprising a guide adapted to be mounted within a housing of the personal communication device, wherein the guide is adapted to retain the wafer to a particular area of the personal communication device, and wherein the wafer is not coupled to the guide or to the housing of the personal communication device.

7. The alert apparatus of claim 1 further comprising a second clamp positioned at an opposite end of the wafer, adapted to further couple the wafer to the housing of the personal communication device.

8. The alert apparatus of claim 1 further comprising a weight attached to the wafer.

9. The alert apparatus of claim 1 further comprising:

a bracket mounted in a fixed relation to the housing of the personal communication device; and a speaker cone attached at its narrow end to the wafer and attached at its open end to the bracket.

10. A personal communication device comprising:

a housing;

a receiver component, mounted within the housing, for receiving messages transmitted to the communication device;

a processor, mounted within the housing, operatively coupled to the receiver component for processing messages received by the receiver component;

an alarm apparatus operatively coupled to the processor, the alarm including:

a mechanically prestressed piezoelectric wafer positioned within the personal communication device, the wafer having at least two points where polarity is recognized; and an alternating voltage input line operatively coupled to at least two points of the wafer where polarity is recognized; and a clamp, positioned at an end of the wafer, coupling the wafer within the housing of the personal communication device.

11. The personal communication device of claim 10 further comprising a guide mounted within the housing of the personal communication device and enclosing the wafer and retaining the wafer to a particular area within the housing of the personal communication device, wherein the wafer is not coupled to the guide or to the housing of the personal communication device.

12. The personal communication device of claim 10, wherein the alarm further includes:

a variable frequency device coupled to the alternating voltage input line, operative to switch the alternating voltage on the alternating voltage input line at least between an alternating voltage having a first frequency and an alternating voltage having a second frequency;

wherein the first frequency is sufficiently high so as to cause the wafer to vibrate at a resulting frequency that produces a sound perceptible by a human ear and the second frequency is sufficiently low so as to cause the wafer to vibrate at a resulting frequency that produces a vibration readily felt by a holder of the personal communication device.

13. The alert apparatus of claim 12, wherein the first frequency is approximately 1,200 Hz to approximately 12,000 Hz and the second frequency is less than approximately 300 Hz.

14. The personal communication device of claim 13, further comprising a voltage amplifier operatively coupled to the alternating voltage input line to amplify the alternating voltage input to the wafer, producing an amplified voltage signal.

15. The personal communication device of claim 14, wherein the amplified voltage signal is approximately 20 Volts to approximately 120 Volts.

16. The personal communication device of claim 10 further comprising:

a bracket mounted in a fixed relation to the housing of the personal communication device; and a speaker cone attached at its narrow end to the wafer and attached at its open end to the bracket.

17. The personal communication device of claim 10 further comprising a second clamp positioned at an opposite end of the wafer, further coupling the wafer to the housing of the personal communication device.

18. The personal communication device of claim 10 further comprising a weight attached to the wafer.

19. An alert apparatus for a personal communication device comprising:

a piezoelectric wafer adapted to be positioned within the personal communication device, the wafer having two sides where polarity is recognized;

an alternating current Input line coupled at the two sides of the wafer where polarity is recognized;

a switch coupled to the alternating current input line, operative to switch the alternating current on the alternating current input line at least between an alternating current having a first frequency and an alternating current having a second frequency; and a clamp, positioned at an end of the wafer, adapted to couple the wafer to a housing of the personal communication device;

wherein the first frequency is sufficiently high so as to cause the wafer to vibrate at a resulting frequency that produces a sound perceptible by a human ear and the second frequency is sufficiently low so as to cause the wafer to vibrate at a resulting frequency that produces a vibration readily felt by a holder of the personal communication device.

20. The alert apparatus of claim 19, wherein the first frequency is approximately 1200 to 20,000 Hz and the second frequency is less than approximately 300 Hz.

21. The alert apparatus of claim 19, further comprising:

a bracket adapted to be mounted in a fixed relation to a housing of the personal communication device; and a speaker cone attached at its narrow end to the wafer and attached at its open end to the bracket.

22. The alert apparatus of claim 19, farther comprising a second clamp positioned at an opposite end of the wafer, adapted to further couple the wafer to the housing of the personal communication device.

23. The alert apparatus of claim 19, further comprising a weight attached to the wafer.

24. The alert apparatus of claim 19, further comprising a diaphragm attached to the wafer.

25. The alert apparatus of claim 19, wherein the first frequency is approximately 1200 to 6000 Hz and the second frequency is less than approximately 300 Hz.

26. The alert apparatus of claim 19, further comprising a voltage amplifier operatively coupled to the alternating current input line to amplify the alternating current input to the wafer to produce an amplified voltage signal.

27. The alert apparatus of claim 26, wherein the amplified voltage signal is approximately 1.5 Volts to approximately 10 Volts.

28. The alert apparatus of claim 26, wherein the amplified voltage signal is approximately 20 Volts to approximately 120 Volts.

29. A personal communication device comprising:

a housing;

a receiver component, mounted within the housing, for receiving messages transmitted to the communication device;

a processor, mounted within the housing, operatively coupled to the receiver component for processing messages received by the receiver component;

an alert apparatus operatively coupled to the processor, the alert including:

a high frequency current supply;

a low frequency current supply;

a piezoelectric wafer positioned within the personal communication device, the wafer having two sides where polarity is recognized;

an alternating current input line coupled at the two sides of the wafer where polarity is recognized; and a switch coupled between the high frequency current supply, the low frequency current supply and the alternating current input line, operative to selectively couple the alternating current input line to at least the high frequency current supply or to the low frequency current supply; and a clamp positioned at an end of the wafer, coupling the wafer within the housing;

wherein the frequency of the high frequency current supply is sufficiently high so as to cause the wafer to vibrate at a resulting frequency that produces a sound perceptible by a human ear and the frequency of the low frequency current supply is sufficiently low so as to cause the wafer to vibrate at a resulting frequency that produces a vibration readily felt by a holder of the personal communication device.

30. The personal communication device of claim 29, wherein the frequency of the high frequency current supply is approximately 1200 to 6000 Hz and the frequency of the low frequency current supply is less than approximately 300 Hz.

31. The personal communication device of claim 29, further comprising a voltage amplifier operatively coupled to the alternating current input line to amplify the alternating current input line to the wafer, producing an amplified voltage signal.

32. The personal communication device of claim 29, further comprising a second clamp positioned at an opposite end of the wafer, further coupling the wafer to the housing.

33. The personal communication device of claim 29, further comprising a weight attached to the wafer.

34. The personal communication device of claim 29, further comprising a diaphragm attached to the wafer.

35. The personal communication device of claim 29, wherein the switch is manually operated.

36. The personal communication device of claim 29, wherein the switch is operated by the processor.

37. The personal communication device of claim 29, wherein both the high frequency current supply and the low frequency current supply are respective output lines from the processor.

38. The personal communication device of claim 31, wherein the amplified voltage signal is approximately 1.5 Volts to approximately 10 Volts.

39. The personal communication device of claim 31, wherein the frequency of the high frequency current supply is approximately 1200 to 20,000 Hz and the frequency of the low frequency current supply is less than approximately 300 Hz.

40. The personal communication device of claim 31, wherein the amplified voltage signal is approximately 20 Volts to approximately 120 Volts.

41. The personal communication device of claim 29, further comprising:

a bracket mounted in a fixed relation to the housing; and a speaker cone attached at its narrow end to the wafer and attached at its open end to the bracket.

42. The personal communication device of claim 41, wherein the high frequency current supply causes the wafer to vibrate at a resulting frequency that produces a sound perceptible by a human ear, wherein said sound is a sound in a voice frequency range.

* * * * *